(12) United States Patent
Wang et al.

(10) Patent No.: US 10,804,104 B2
(45) Date of Patent: Oct. 13, 2020

(54) SEMICONDUCTOR DEVICE AND METHOD FOR FORMING P-TYPE CONDUCTIVE CHANNEL IN DIAMOND USING ABRUPT HETEROJUNCTION

(71) Applicant: The 13th Research Institute Of China Electronics Technology Group Corporation, Shijiazhuang (CN)

(72) Inventors: Jingjing Wang, Shijiazhuang (CN); Zhihong Feng, Shijiazhuang (CN); Cui Yu, Shijiazhuang (CN); Chuangjie Zhou, Shijiazhuang (CN); Qingbin Liu, Shijiazhuang (CN); Zezhao He, Shijiazhuang (CN)

(73) Assignee: The 13th Research Institute Of China Electronics Technology, Shijiazhuang (CN)

( * ) Notice: Subject to any disclaimer, the term of this patent is extended or adjusted under 35 U.S.C. 154(b) by 0 days.

(21) Appl. No.: 15/838,886

(22) Filed: Dec. 12, 2017

(65) Prior Publication Data

US 2019/0115214 A1  Apr. 18, 2019

(30) Foreign Application Priority Data

Oct. 12, 2017  (CN) .......................... 2017 1 0948663

(51) Int. Cl.
*H01L 21/04* (2006.01)
*H01L 21/02* (2006.01)
(Continued)

(52) U.S. Cl.
CPC ...... *H01L 21/0405* (2013.01); *H01L 21/0254* (2013.01); *H01L 21/0262* (2013.01);
(Continued)

(58) Field of Classification Search
CPC ......... H01L 21/02376; H01L 21/02444; H01L 21/02527; H01L 21/0405; H01L 21/3003; H01L 29/1602
See application file for complete search history.

(56) References Cited

U.S. PATENT DOCUMENTS

| 2010/0078651 A1* | 4/2010 | Wort | ................... H01L 21/0262 257/77 |
| 2017/0018639 A1* | 1/2017 | Teo | ..................... H01L 21/8258 |
| 2018/0151715 A1* | 5/2018 | Chowdhury | ........ H01L 29/7827 |

* cited by examiner

*Primary Examiner* — David C Spalla
(74) *Attorney, Agent, or Firm* — Dinsmore & Shohl LLP

(57) ABSTRACT

The present application discloses a semiconductor device and a method for forming a p-type conductive channel in a diamond using an abrupt heterojunction, which pertain to the technical field of fabrication of semiconductor devices. The method includes: forming a diamond layer on a substrate; forming one or multiple layers of a heterogeneous elementary substance or compound having an acceptor characteristic on an upper surface of the diamond layer; forming a heterojunction at an interface between the diamond layer and an acceptor layer; forming two-dimensional hole gas at one side of the diamond layer with a distance of 10 nm-20 nm away from the heterojunction; and using the two-dimensional hole gas as a p-type conductive channel. The method enables a concentration and a mobility of carriers to maintain stable at a temperature range of 0° C.-1000° C., thereby realizing normal operation of the diamond device at high temperature environment.

10 Claims, 6 Drawing Sheets

(51) Int. Cl.
    *H01L 21/30*     (2006.01)
    *H01L 21/304*    (2006.01)
    *H01L 29/16*     (2006.01)
    *H01L 29/778*    (2006.01)
    *H01L 29/267*    (2006.01)
    *H01L 29/20*     (2006.01)
(52) U.S. Cl.
    CPC .. *H01L 21/02381* (2013.01); *H01L 21/02444* (2013.01); *H01L 21/02527* (2013.01); *H01L 21/02664* (2013.01); *H01L 21/041* (2013.01); *H01L 21/3003* (2013.01); *H01L 21/304* (2013.01); *H01L 29/1602* (2013.01); *H01L 29/267* (2013.01); *H01L 21/02579* (2013.01); *H01L 29/2003* (2013.01); *H01L 29/7786* (2013.01)

SEMICONDUCTOR DEVICE AND METHOD FOR FORMING P-TYPE CONDUCTIVE CHANNEL IN DIAMOND USING ABRUPT HETEROJUNCTION

CROSS-REFERENCE TO RELATED APPLICATIONS

This application claims priority of China Patent Application No. 201710948663.X filed Oct. 12, 2017.

FIELD OF THE INVENTION

The present application relates to the technical field of fabrication of semiconductor devices, and more particularly relates to a semiconductor device and a method for forming a p-type conductive channel in a diamond using an abrupt heterojunction.

BACKGROUND OF THE INVENTION

As a wide-bandgap semiconductor material, diamond possesses a bandgap of 5.5 eV, high thermal conductivity (12 $Wcm^{-1} \cdot K^{-1}$), high breakdown field, stable chemical characteristics, and extremely strong radiation resistance, such performances make the diamond be the ideal material for fabricating electronic devices of high frequency, high power, radiation resistance, high temperature resistance, and electrical power resistance. One prerequisite for the fabrication of the semiconductor device is to realize the effective conductive channel on the diamond material with high resistance. A typical method for fabricating the highly effective p-type conductive channel includes: processing a surface of the diamond to form a hydrogen-terminated diamond covered with C—H bonds, a near surface absorption layer is formed in the air, the near surface absorption layer contains polar molecules, such as water molecules and $CO_2$ molecules. Due to the interaction between the C—H bonds and polar molecules of the absorption layer, a conductive p-type conductive channel is formed in a near surface layer in the diamond via carrier transfer. Because the near surface absorption layer acting as the acceptor layer is primarily provided by the air of the environment, the near surface system is greatly affected by the environment and therefore easily damaged, particularly during high-temperature working. the polar molecules will be desorbed and escaped from the near surface absorption layer of the diamond, thus resulting in failure of the p-type channel.

In conventional element doping, boron is generally adopted to conduct p-type doping. The basic physical mechanism of such doping is that impurity ionization releases excess carriers, at low doping concentration, impurity ionization is strongly inhibited with an activation rate of less than 1% and at high doping concentration, the introduction of doping will result in relatively strong ionized impurity scattering and affect the carrier mobility, which makes the carrier mobility almost reduce to 0. Both the two methods will restrict the application of the diamond device. While the inherent advantages of the diamond is exactly the excellent thermal conductivity, high-temperature resistance, and radiation resistance, when the diamond is used to fabricate high-temperature resistant device, the p-type channel presents poor thermal stability, which just restricts the inherent advantage of the diamond device. Thus, it is a prerequisite to realize the stable channel in order to facilitate the application of diamond high-temperature power device.

SUMMARY OF THE INVENTION

In view of the above-described problems, it is an object of the the present application to provide a method for forming a semiconductor device a p-type conductive channel in a diamond using an abrupt heterojunction, such that a concentration and a mobility of carries in a p-type channel of the diamond maintain stable within a temperature range of 0° C.-1000° C.

In order to solve the above-described problems, the present application adopts the following technical solution: a method for forming a p-type conductive channel in a diamond using an abrupt heterojunction, comprises the following steps:

forming a diamond layer on a substrate;

processing the diamond layer into a hydrogen-terminated diamond layer so that an upper surface of the hydrogen-terminated diamond layer possesses C—H bonds; and forming one or multiple layers of a heterogeneous elementary substance or compound having an acceptor characteristic on the upper surface of the hydrogen-terminated diamond layer, forming a heterojunction at an interface between the hydrogen-terminated diamond layer and an acceptor layer, forming two-dimensional hole gas at one side of the hydrogen-terminated diamond layer with a distance of 10 nm-20 nm away from the heterojunction, and using the two-dimensional hole gas as a p-type conductive channel.

In an embodiment of the present application, the method further comprises: before forming the one or multiple layers of the heterogeneous elementary substance or compound having the acceptor characteristic, performing polishing treatment or epitaxial growth treatment on the diamond layer with polishing treatment or epitaxial growth process to acquire a smoother upper surface.

In an embodiment of the present application, the diamond layer 2 is grown on the substrate via microwave plasma enhanced chemical vapor deposition (MPCVD).

In an embodiment of the present application, the elementary substance is boron (B), nitrogen (N), fluorine (F), lithium (Li), sodium (Na), calcium (Ca), magnesium (Mg), potassium (K), silicon (Si), germanium (Ge), zinc (Zn), or iron (Fe).

In an embodiment of the present application, the compound is $B_xN_y$, $Ga_xN_y$, $Al_xN_y$, $Si_xN_y$, $B_xN_y$, $Fe_xN_y$, $Ga_xO_y$, $Al_xO_y$, $Si_xO_y$, $Hf_xO_y$, $Fe_xO_y$, $B_xF_y$, $Ga_xF_y$, $A_xF_y$, $Si_xF_y$, $B_xF_y$, $Al_xGa_yN_z$, or $Si_xB_yN_z$, in which values of x, y, and z represent the numbers of atoms of corresponding elements in the compound and relate to valences of the corresponding elements.

The present application further discloses a semiconductor device, which comprises: a substrate; a diamond layer defined on an upper surface of the substrate, wherein. C—H bonds are formed on an upper surface of the diamond layer; one or multiple layers of a heterogeneous elementary substance or compound having an acceptor characteristic defined on the upper surface of the diamond layer; a heterojunction formed at an interface between the diamond layer and the acceptor layer, and two-dimensional hole gas formed at one side of the diamond layer with a distance of 10 nm-20 nm from the heterojunction, wherein the two-dimensional hole gas is used as a p-type conductive channel.

In an embodiment of the present application, an epitaxial diamond layer is defined between the diamond layer and the acceptor layer.

In an embodiment of the present application, a thickness of the one or multiple layers of a heterogeneous elementary substance or compound having an acceptor characteristic is 1 nm-100 sm.

In an embodiment of the present application, the elementary substance is boron (B), nitrogen (N), fluorine (F), lithium (Li), sodium (Na), calcium (Ca), magnesium (Mg), potassium (K), silicon (Si), germanium (Ge), zinc (Zn), or iron (Fe).

In an embodiment of the present application, the compound is $B_xN_y$, $Ga_xN_y$, $Al_xN_y$, $Si_xN_y$, $B_xN_y$, $Fe_xN_y$, $Ga_xO_y$, $Al_xO_y$, $Si_xO_y$, $Hf_xO_y$, $Fe_xO_y$, $B_xF_y$, $Ga_xF_y$, $Al_xF_y$, $Si_xF_y$, $B_xF_y$, $Al_xGa_yN_z$, or $Si_xB_yN_z$, in which values of x. y, and z represent the numbers of atoms of corresponding elements in the compound and relate to valences of the corresponding elements.

The above-described technical solution has the following advantageous effects: for such polarization-doping of the above-described method of the present application, the polarization between the diamond layer possessing C—H terminals and the acceptor layer is utilized to form the two-dimensional hole gas. The doping is caused by the inherent polarization effect of the material, the influence of the temperature can almost be neglected, and the relatively stable doping efficiency can be maintained at extremely low temperature.

Figure 1:
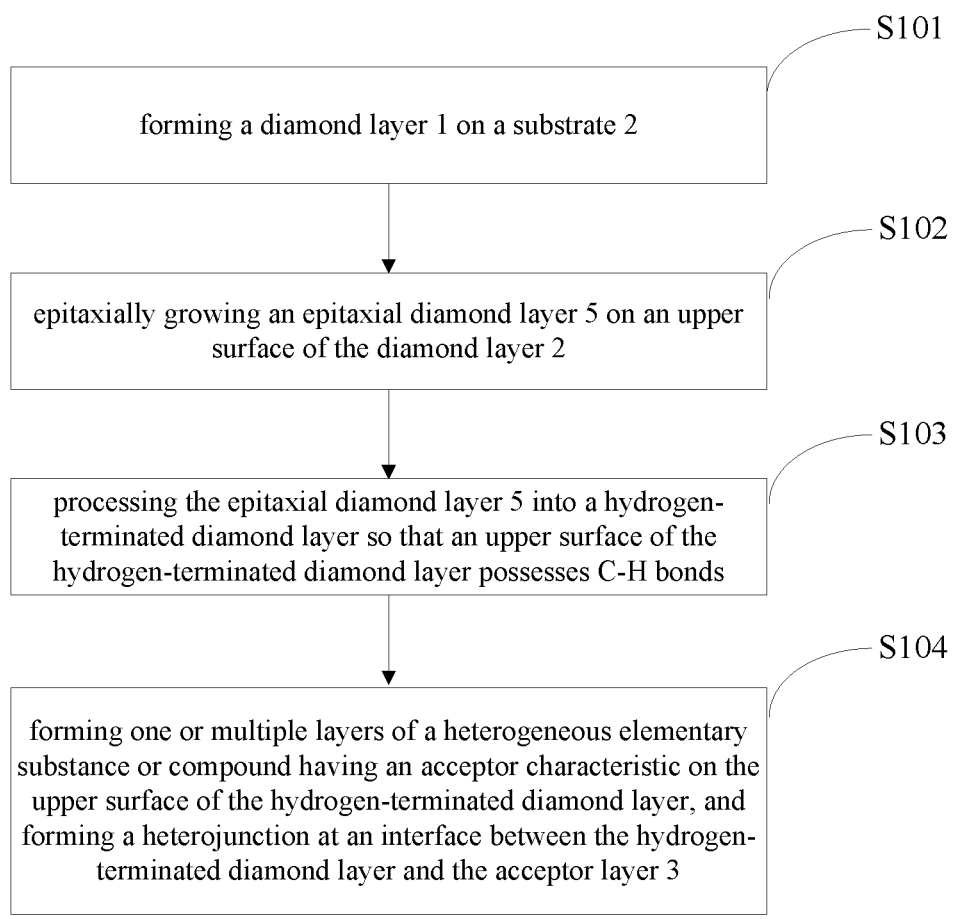
FIG. 1 is a flow chart of a method of a first embodiment of the present application.

In the drawings, the following reference numerals are used: 1. Substrate; 2. Diamond layer, 3. Acceptor layer; 4. Two-dimensional hole gas; 5. Epitaxial diamond layer; and 6. Interface between the diamond layer and the acceptor layer.

DETAILED DESCRIPTION OF THE PREFERRED EMBODIMENTS

Detailed description of the present application will be given below in conjunction with accompanying drawings. It is apparently that all the described embodiments are only a part of embodiments, but not all parts of embodiments, of the present application. Based on the embodiments of the present application, all other embodiments acquired by those skilled in the art without making any creative efforts fall within the protection scope of the present application.

Many specific details are described in the following description to make the present application fully understood, however, the present application can also adopt other modes that are different from those described herein to be carried out, the skilled persons in the art can make similar promotion without departing from the spirits of the present application, and therefore the present application is not limited to the specific embodiments as disclosed hereinafter.

Example 1

In general, as shown in FIG. 1, the present application discloses a method for forming a p-type conductive channel in a diamond using an abrupt heterojunction, and the method comprised the following steps:

S101: a diamond layer 1 was formed on a substrate 2;

S102: an epitaxial diamond layer 5 was epitaxially grown on an upper surface of the diamond layer 2;

S103: the epitaxial diamond layer 5 was processed into a hydrogen-terminated diamond layer so that an upper surface of the hydrogen-terminated diamond layer possessed C—H bonds; and S104: one or multiple layers of a heterogeneous elementary substance or compound having an acceptor characteristic was formed on the upper surface of the hydrogen-terminated diamond layer, a heterojunction was formed at an interface between the hydrogen-terminated diamond layer and the acceptor layer 3, two-dimensional hole gas 4 was formed at one side of the hydrogen-terminated diamond layer with a distance of 10 nm-20 nm away from the heterojunction, and the two-dimensional hole gas 4 was used as a p-type conductive channel.

Figure 2:
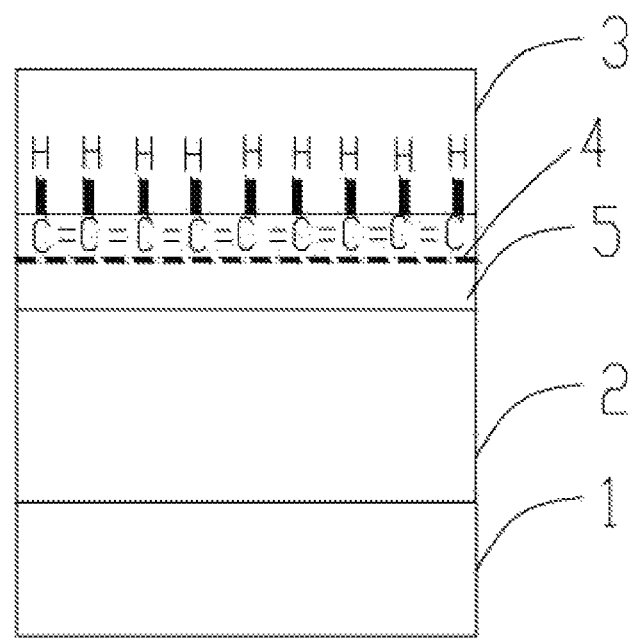
FIG. 2 is a structural schematic view of a semiconductor device of the first embodiment of the present application.

Corresponding to the above-described method, as shown in FIG. 2, the present application further discloses a semiconductor device, which comprises: a substrate 1; a diamond layer 2 defined on an upper surface of the substrate 1, in which, the upper surface of the diamond layer 2 is smoothly designed or defines an epitaxial diamond layer 5, C—H bonds are formed on an upper surface of the epitaxial diamond layer 5; one or multiple layers of a heterogeneous elementary substance or compound having an acceptor characteristic defined on a smooth upper surface of the diamond layer 2 or the upper surface of the epitaxial diamond layer 5; a heterojunction formed at an interface between the diamond and the acceptor layer 3; and two-dimensional hole gas 4 formed at one side of the diamond with a distance of 10 nm-20 nm away from the heterojunction, in which, the two-dimensional hole gas 4 is used as a p-type conductive channel.

Preferably, any one of methods in the prior art can be used in the method of the present application to acquire the diamond layer 2. Preferably, the upper surface of the diamond layer can be processed by any polishing methods, including mechanical polishing, chemical polishing, etc. The method for epitaxial growth of the diamond layer can be any film growing method, including physical vapor deposition, chemical vapor deposition, sol-gel method, transferring. etc.

Preferably, as for the any one or multiple layers of the heterogeneous elementary substance or compound that can generate the acceptor characteristic at the interface when contacting with the diamond layer, the elementary substance is any elementary substance that can exist in the solid form, such as, boron (B), nitrogen (N), fluorine (F), lithium (Li), sodium (Na), calcium (Ca), magnesium (Mg), potassium (K), silicon (Si), germanium (Ge), zinc (Zn), iron (Fe), etc. The compound is a nitride, such as $B_xN_y$, $Ga_xN_y$, $A_xN_y$, $Si_xN_y$, $B_xN_y$, and $Fe_xN_y$; an oxide, such as $Ga_xO_y$, $Al_xO_y$, $Si_xO_y$, $Hf_xO_y$, $Fe_xO_y$, etc.; a fluoride, such as $B_xF_y$, $Ga_xF_y$, $Al_xF_y$, $Si_xF_y$, $B_xF_y$, etc; or a ternary compound, such as $Al_xGa_yN_z$, $Si_xB_yN_z$, etc., in which values of x, y, and z represent the numbers of atoms of corresponding elements in the compound and relate to valences of the corresponding elements.

Figure 7:
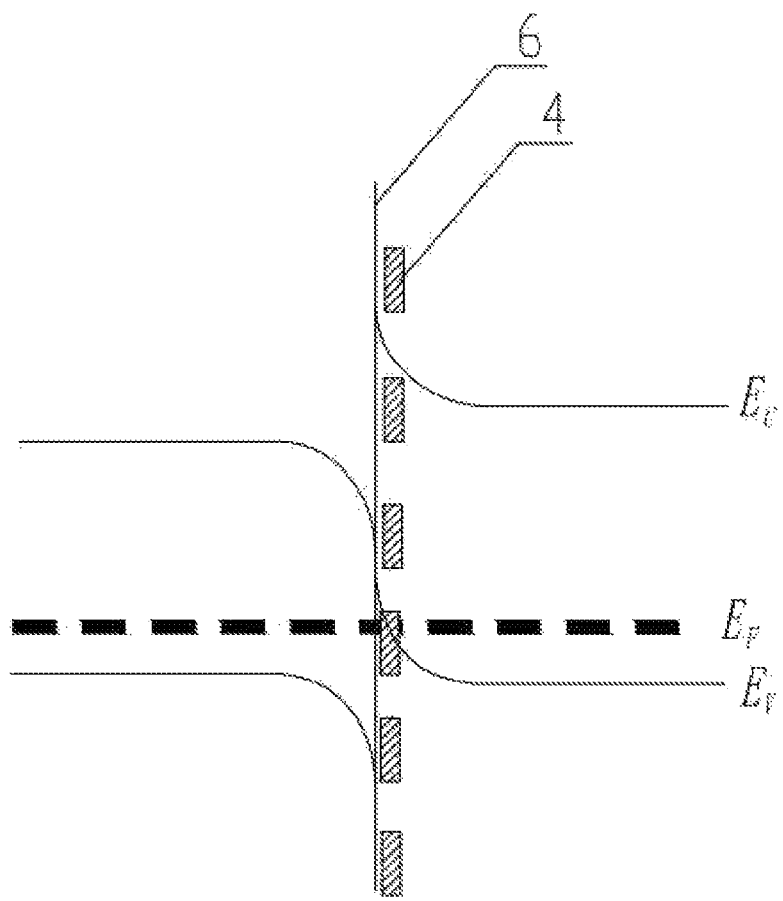
FIG. 7 is a principle diagram illustrating energy bands of the semiconductor device of embodiments of the present application.

For such polarization-doping of the above-described method of the present application, the polarization between the diamond layer possessing C—H terminals and the acceptor layer is utilized to form the two-dimensional hole gas. The doping is caused by the inherent polarization effect of the material, the influence of the temperature can almost be neglected, and the relatively stable doping efficiency can be maintained at extremely low temperature. The removal of ionized impurity scattering also greatly improves the carrier mobility in the material. FIG. 7 is a schematic diagram illustrating energy bands of the semiconductor device of the embodiments of the present application. A left side of FIG. 7 represents the acceptor layer, and a right side represents the diamond layer, E represents a bottom of a conduction band, $E_F$ represents a Fermi level, and $E_V$ represents a valence band maximum.

Example 2

Figure 3:
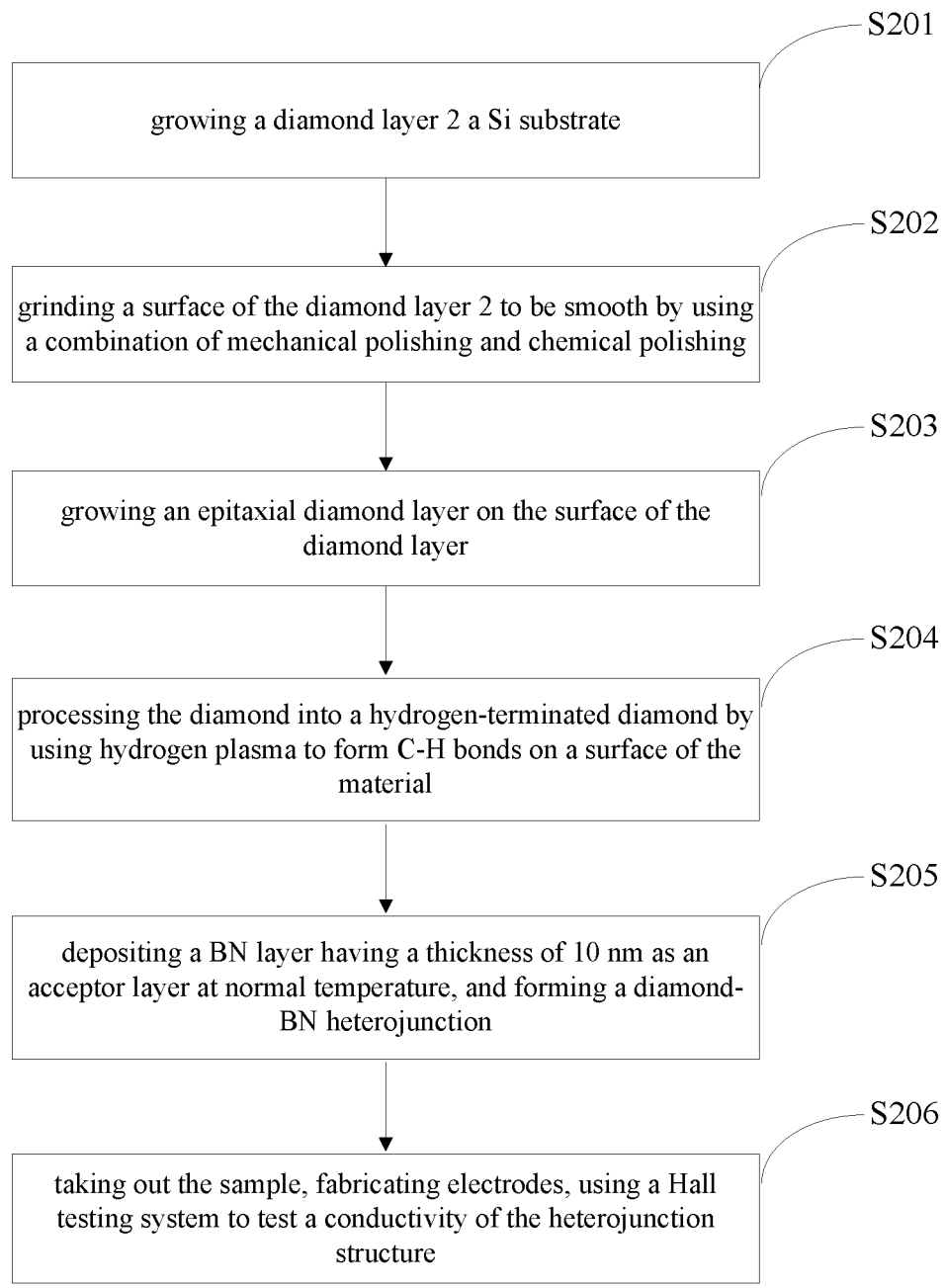
FIG. 3 is a flow chart of a method of a second embodiment of the present application.

As shown in FIG. 3, the present application discloses a method for forming a p-type conductive channel in a diamond using an abrupt heterojunction. The method comprised the following steps:

S201: a diamond layer 2 having a thickness of 500 μm was grown on a silicon (Si) substrate by using MPCVD;

S202: a surface of the diamond layer 2 was grinded to a roughness of 1 nm by using a combination of mechanical polishing and chemical polishing;

S203: a diamond acquired from the treatment was placed in an MPCVD device, the MPCVD device was evacuated to reach a pressure of 10-mbar, thereafter, mixed gas of CHaan $H_2$ was introduced, in which, a flow rate of $CH_4$ was 1000 mL/min and a flow rate of $H_2$ was 20 L/min, a pressure of a reaction chamber was 100 mbar, a growing time was 5 hrs, and a high qualified diamond epitaxial film having a thickness of 500 nm was deposited;

S204: the diamond acquired from the treatment of S203 was placed in the MPCVD device, the hydrogen plasma was used to process the diamond into a hydrogen-terminated diamond such that C—H bonds were formed on a surface of the material;

S205: a sample was taken out and transferred to an atomic layer deposition device to deposit a BN layer having a thickness of 10 nm as an acceptor layer, and a diamond-BN heterojunction was formed; and S206: the sample was taken out to fabricate electrodes, a Hall testing system was adopted to test a conductivity of the heterojunction structure, the sample was the p-type, and the carrier mobility was 1000 $cm^2/V·s$.

Figure 4:
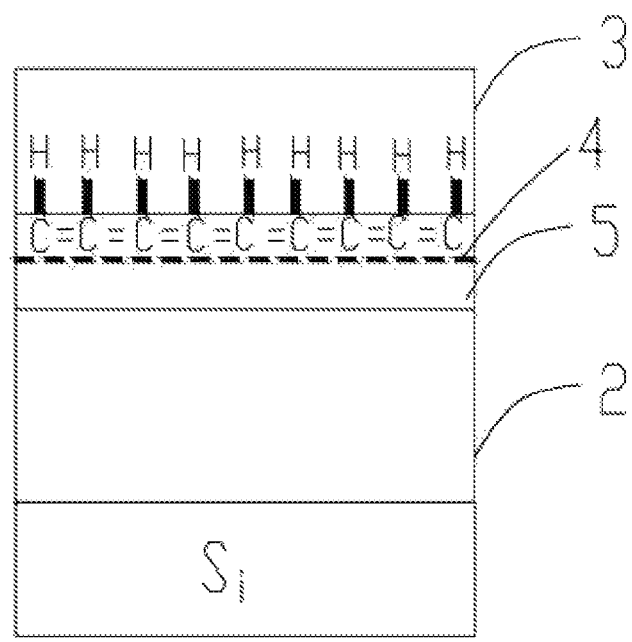
FIG. 4 is a structural schematic view of a semiconductor device of the second embodiment of the present application.

As shown in FIG. 4, the present application discloses a semiconductor device, which comprises a substrate 1, the substrate 1 is a silicon substrate, a diamond layer 2 is defined on an upper surface of the substrate 1, an epitaxial diamond layer 5 is defined on an upper layer of the diamond layer 2, the epitaxial diamond layer 5 is processed to make the surface thereof possess C—H bonds, and one or multiple BN layers (acceptor layer 3) having the acceptor characteristics is defined on the upper surface of the epitaxial diamond layer 5. A heterojection is formed at the interface between the diamond and the acceptor layer 3, two-dimensional hole gas 4 is formed one side of the diamond with a distance of 10 nm-20 nm away from the heterojunction, and the two-dimensional hole gas 4 is used as the p-type conductive channel.

Example 3

Figure 5:
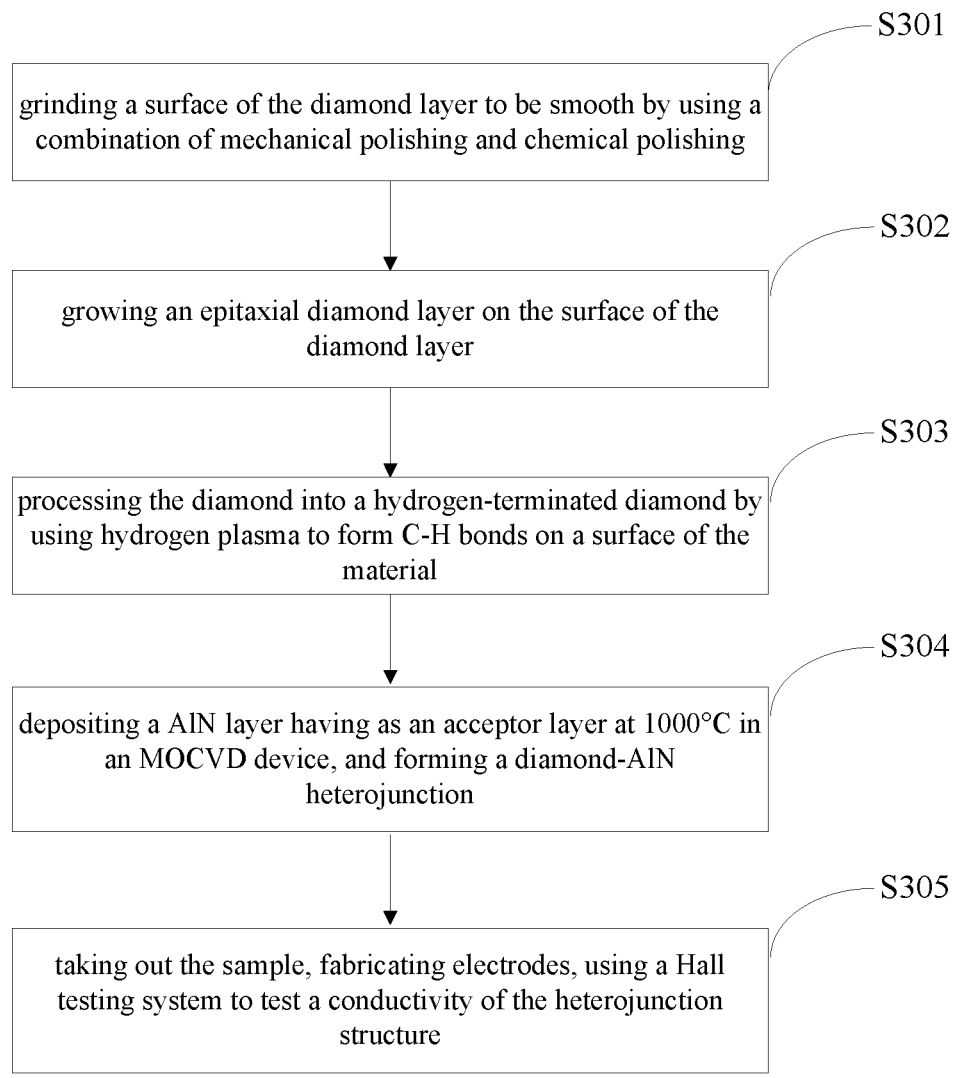
FIG. 5 is a flow chart of a method of a third embodiment of the present application.

As shown in FIG. 5, the present application discloses a method for forming a p-type conductive channel in a diamond using an abrupt heterojunction.

S201: a surface of a diamond layer was grinded to a roughness of 1 nm by using a combination of mechanical polishing and chemical polishing;

S202: a diamond acquired from the treatment was placed in an MPCVD device, the MPCVD device was evacuated to reach a pressure of 10-6 mbar, thereafter, mixed gas of CH4 an $H_2$ was introduced, in which, a flow rate of CH4 was 1000 mL/min and a flow rate of $H_2$ was 20 L/min, a pressure of a reaction chamber was 100 mbar, a growing time was 5 hrs, and a high qualified diamond epitaxial film having a thickness of 500 nm was deposited;

S203: the diamond acquired from the treatment of S202 was placed in the MPCVD device, the hydrogen plasma was used to process the diamond into a hydrogen-terminated diamond such that C—H bonds were formed on a surface of the material;

S204: a sample was taken out and transferred to a metal-organic chemical vapor deposition (MOCVD) device to deposit an AlN layer having a thickness of 20 nm as an acceptor layer at a temperature of 1000° C. and a diamond-AlN heterojunction was formed.

S205: the sample was taken out to fabricate electrodes, a Hall testing system was adopted to test a conductivity of the heterojunction structure, the sample was the p-type, and the carrier mobility was 2000 cm2/V·s.

Figure 6:
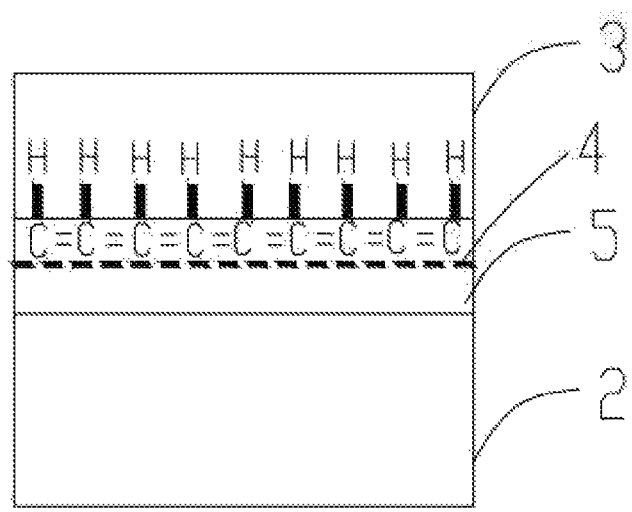
FIG. 6 is a structural schematic view of a semiconductor device of the third embodiment of the present application.

As shown in FIG. 6, the present application discloses a semiconductor device, which comprises a substrate 1, the substrate 1 is a diamond, an epitaxial diamond layer 5 is defined on an upper layer of the substrate 1, the epitaxial diamond layer 5 is processed to make the surface thereof possess C—H bonds, and one or multiple AlN layer (acceptor layer 3) having the acceptor characteristics is defined on the upper surface of the epitaxial diamond layer 5. A heterojection is formed at the interface between the diamond and the acceptor layer 3, two-dimensional hole gas 4 is formed one side of the diamond with a distance of 10 nm-20 nm away from the heterojunction, and the two-dimensional hole gas 4 is used as the p-type conductive channel.

The method of the present application utilizes the component mutation of the material at the heterojunction interface, which causes mutation of the polarization intensity and conduction band offset, a great quantity of free holes in a Quasi-two-dimensional distribution will be generated at the heterojunction interface, thus forming the two-dimensional hole gas. Taken the BN/diamond as an example, the BN is a binary solid solution, and has a lattice mismatch with the diamond, such that BN and the diamond can form the heterojunction; the polarization between the C—H terminal diamond and the acceptor layer is adopted, such that the two-dimensional hole gas (2DHG) is acquired from a triangular potential barrier of a bend region of the energy band at the heterojunction interface, the two-dimensional gas is restricted at a very thin layer at the interface and isolated from a physical position of a scattering center of ionized impurities, so that very high mobility can be acquired.

The invention claimed is:

1. A method for forming a p-type conductive channel in a diamond using an abrupt heterojunction, comprising the following steps:

forming a diamond layer on a substrate;

processing the diamond layer into a hydrogen-terminated diamond layer so that an upper surface of the hydrogen-terminated diamond layer possesses C—H bonds; and forming one or multiple layers of a heterogeneous elementary substance or compound having an acceptor characteristic on the upper surface of the hydrogen-terminated diamond layer, forming a heterojunction at an interface between the hydrogen-terminated diamond layer and an acceptor layer, forming two-dimensional hole gas at one side of the hydrogen-terminated diamond layer with a distance of 10 nm-20 nm away from the heterojunction, and using the two-dimensional hole gas as a p-type conductive channel;

wherein the elementary substance is boron (B), nitrogen (N), fluorine (F), lithium (Li), sodium (Na), calcium (Ca), magnesium (Mg), potassium (K), silicon (Si), germanium (Ge), zinc (Zn), or iron (Fe); and the compound is $Ga_xN_y$, $Si_xN_y$, $Fe_xN_y$, $Ga_xO_y$, $Al_xO_y$, $Hf_xO_y$, $Fe_xO_y$, $B_xF_y$, $Ga_xF_y$, $Al_xF_y$, $Si_xF_y$, $B_xF_y$, or $Si_xB_yN_z$, in which values of x, y, and z represent the numbers of atoms of corresponding elements in the compound and relate to valences of the corresponding elements.

2. The method of claim 1, further comprising: before forming the one or multiple layers of the heterogeneous elementary substance or compound having the acceptor characteristic, performing polishing treatment or epitaxial growth treatment on the diamond layer with polishing treatment or epitaxial growth process to acquire a smoother upper surface.

3. The method of claim 1, wherein the diamond layer is grown on the substrate via microwave plasma enhanced chemical vapor deposition.

4. The method of claim 1, wherein the diamond layer is processed into a hydrogen-terminated diamond layer by using hydrogen plasma.

5. A semiconductor device, comprising:

a substrate;

a diamond layer defined on an upper surface of the substrate, wherein, C—H bonds are formed on an upper surface of the diamond layer;

one or multiple layers of a heterogeneous elementary substance or compound having an acceptor characteristic defined on the upper surface of the diamond layer to form an acceptor layer;

a heterojunction formed at an interface between the diamond layer and the acceptor layer; and two-dimensional hole gas formed at one side of the diamond layer with a distance of 10 nm-20 nm away from the heterojunction, wherein the two-dimensional hole gas is used as a p-type conductive channel;

wherein the elementary substance is boron (B), nitrogen (N), fluorine (F), lithium (Li), sodium (Na), calcium (Ca), magnesium (Mg), potassium (K), silicon (Si), germanium (Ge), zinc (Zn), or iron (Fe); and the compound is $Ga_xN_y$, $Si_xN_y$, $Fe_xN_y$, $Ga_xO_y$, $Al_xO_y$, $Hf_xO_y$, $Fe_xO_y$, $B_xF_y$, $Ga_xF_y$, $Al_xF_y$, $Si_xF_y$, $B_xF_y$, or $Si_xB_yN_z$, in which values of x, y, and z represent the numbers of atoms of corresponding elements in the compound and relate to valences of the corresponding elements.

6. The semiconductor device of claim 5, wherein an epitaxial diamond layer is defined between the diamond layer and the acceptor layer.

7. The semiconductor device of claim 5, wherein a thickness of the one or multiple layers of a heterogeneous elementary substance or compound having an acceptor characteristic is 1 nm-100 μm.

8. A semiconductor device, comprising:

a substrate;

a diamond layer defined on an upper surface of the substrate, wherein, C—H bonds are formed on an upper surface of the diamond layer;

one or multiple layers of a heterogeneous elementary substance having an acceptor characteristic defined on the upper surface of the diamond layer to form an acceptor layer;

a heterojunction formed at an interface between the diamond layer and the acceptor layer; and two-dimensional hole gas formed at one side of the diamond layer with a distance of 10 nm-20 nm away from the heterojunction, wherein the two-dimensional hole gas is used as a p-type conductive channel;

wherein the elementary substance is boron (B), nitrogen (N), fluorine (F), lithium (Li), sodium (Na), calcium (Ca), magnesium (Mg), potassium (K), silicon (Si), germanium (Ge), zinc (Zn), or iron (Fe).

9. The semiconductor device of claim 8, wherein an epitaxial diamond layer is defined between the diamond layer and the acceptor layer.

10. The semiconductor device of claim 8, wherein a thickness of the one or multiple layers of a heterogeneous elementary substance having an acceptor characteristic is 1 nm-100 μm.

* * * * *